(12) United States Patent
Inoue et al.

(10) Patent No.: US 10,139,055 B2
(45) Date of Patent: Nov. 27, 2018

(54) FLUORESCENCE LIGHT SOURCE DEVICE WITH PERIODIC STRUCTURE HAVING AN ASPECT RATIO OF 0.5 TO 0.9 AND METHOD FOR PRODUCING THE SAME

(71) Applicant: Ushio Denki Kabushiki Kaisha, Tokyo (JP)

(72) Inventors: Masaki Inoue, Tokyo (JP); Seiji Kitamura, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/329,091

(22) PCT Filed: Jul. 17, 2015

(86) PCT No.: PCT/JP2015/070542
§ 371 (c)(1),
(2) Date: Jan. 25, 2017

(87) PCT Pub. No.: WO2016/017457
PCT Pub. Date: Feb. 4, 2016

(65) Prior Publication Data
US 2017/0227176 A1    Aug. 10, 2017

(30) Foreign Application Priority Data
Jul. 29, 2014  (JP) ................... 2014-153774

(51) Int. Cl.
*F21K 9/64* (2016.01)
*F21V 7/05* (2006.01)
(Continued)

(52) U.S. Cl.
CPC ............... *F21K 9/64* (2016.08); *F21V 7/05* (2013.01); *F21V 9/30* (2018.02); *F21V 29/74* (2015.01);
(Continued)

(58) Field of Classification Search
CPC ... F21K 9/64; F21V 9/16; F21V 5/005; G02B 1/118; G02B 5/0231; F21S 41/14;
(Continued)

(56) References Cited

U.S. PATENT DOCUMENTS

2004/0075897 A1* 4/2004 Ookawa ................ G02B 5/045
359/455
2009/0061150 A1* 3/2009 Noguchi ................ G02B 1/118
428/119
(Continued)

FOREIGN PATENT DOCUMENTS

JP   2002267815 A  * 9/2002
JP   2011-013316 A   1/2011
(Continued)

OTHER PUBLICATIONS

U.S. Appl. No. 15/023,142.*
(Continued)

*Primary Examiner* — Anh Mai
*Assistant Examiner* — Steven Horikoshi
(74) *Attorney, Agent, or Firm* — Studebaker & Brackett PC

(57) ABSTRACT

The fluorescence light source device of the present invention includes a fluorescence member formed from a phosphor composed of single crystal or polycrystal and excited by excitation light. A periodic structure layer made of a high refractive index material having a refractive index of not less than the refractive index of the fluorescence member is formed on the surface of the fluorescence member. The periodic structure layer has a surface with a periodic structure having a periodic array of conical or truncated projections and formed by an etching process. The aspect ratio which is a ratio of the height of the projections to the pitch in the periodic structure is within a range of 0.5 to 0.9.

4 Claims, 6 Drawing Sheets

(51) Int. Cl.
*F21V 29/74* (2015.01)
*F21V 9/30* (2018.01)
*F21Y 115/30* (2016.01)
*G03B 21/20* (2006.01)

(52) U.S. Cl.
CPC ......... *F21Y 2115/30* (2016.08); *G03B 21/204* (2013.01)

(58) Field of Classification Search
CPC ......... F21S 41/16; F21S 41/176; H01L 33/54; H01L 51/5275
See application file for complete search history.

(56) References Cited

U.S. PATENT DOCUMENTS

| 2010/0328776 | A1* | 12/2010 | Sanari | G02B 1/118 359/601 |
| 2013/0056775 | A1* | 3/2013 | Kawakami | F21V 9/16 257/98 |
| 2013/0176739 | A1* | 7/2013 | Uehara | F21V 7/00 362/296.01 |
| 2014/0268063 | A1* | 9/2014 | Akiyama | G03B 21/204 353/20 |
| 2015/0160377 | A1* | 6/2015 | Kuroda | G02B 1/118 428/141 |

FOREIGN PATENT DOCUMENTS

| JP | 2011-198560 A | 10/2011 |
| JP | 2012-109400 A | 6/2012 |
| JP | 2014-029476 A | 2/2014 |
| JP | 2014-036118 A | 2/2014 |
| JP | 2014-082401 A | 5/2014 |
| WO | 2007/148829 A1 | 12/2007 |
| WO | 2014/077132 A1 | 5/2014 |

OTHER PUBLICATIONS

International Search Report issued in PCT/JP2015/070542; dated Oct. 6, 2015.

An Office Action; "Notification of Reasons for Refusal," mailed by the Japanese Patent Office dated Jun. 28, 2016, which aorresponds to Japanese Patent Application No. 2014-153774 and is related to U.S. Appl. No. 15/329,091; with English Translation.

An Office Action; "Decision of Refusal," mailed by the Japanese Patent Office dated Nov. 15, 2016, which aorresponds to Japanese Patent Application No. 2014-153774 and is related to U.S. Appl. No. 15/329,091; with English Translation.

An Office Action issued by the Japanese Patent Office dated Feb. 20, 2018, which corresponds to Japanese Patent pplication No. 2014-153774 and is related to U.S. Appl. No. 15/329,091.

* cited by examiner

FLUORESCENCE LIGHT SOURCE DEVICE WITH PERIODIC STRUCTURE HAVING AN ASPECT RATIO OF 0.5 TO 0.9 AND METHOD FOR PRODUCING THE SAME

TECHNICAL FIELD

The present invention relates to a fluorescence light source device in which fluorescence is emitted from a phosphor by exciting the phosphor with excitation light, and to a method for producing the fluorescence light source device.

BACKGROUND ART

Fluorescence light source devices in which green light is emitted from a phosphor as fluorescence by irradiating the phosphor with laser light, which is excitation light, have been conventionally known as green light sources for use in, for example, projectors. A known example of such fluorescence light source devices is a fluorescence light source device including a wavelength conversion member in which the surface of a rotary wheel is coated with a phosphor. The phosphor in the wavelength conversion member generates light in the green region upon irradiation of the wavelength conversion member with laser light in the blue region (see Patent Literature 1).

However, the fluorescence light source device including the wavelength conversion member provided with the rotary wheel has problems in that motor components that rotatively drive the rotary wheel are likely to deteriorate to cause failures and in that the drive system itself has a complex structure.

Another known example of fluorescence light source devices is, as illustrated in FIG. 11, a fluorescence light source device including a wavelength conversion member in which a fluorescence member 41 composed of a YAG sintered body is disposed on the front surface of a substrate 42 with a barium sulfate layer 43 interposed therebetween (see Patent Literature 2). In this fluorescence light source device, the substrate 42 is a Mo—Cu substrate, and a heat-dissipating fin 45 is disposed on the back surface of the substrate 42. In the fluorescence light source device, the fluorescence member 41 generates light in the green region upon irradiation of the fluorescence member 41 with laser light in the blue region, which is excitation light.

However, such a fluorescence light source device has a problem in that excitation light reflects off the front surface of the fluorescence member 41 when the fluorescence member 41 is irradiated with excitation light, which causes an insufficient amount of excitation light to be introduced into the fluorescence member 41 and results in poor luminous efficacy.

There is thus proposed a fluorescence light source device in which an uneven structure is formed on an excitation-light receiving surface of a wavelength conversion member. This uneven structure reduces the reflection of excitation light off the excitation-light receiving surface (see, for example, Patent Literature 3).

Specifically, Patent Literature 3 discloses a fluorescence light source device including a wavelength conversion member in which a light-transmissive substrate having a substantially rectangle plate shape and having an uneven structure with projections arranged on the surface is disposed on a fluorescence member having a rectangle plate shape. The surface of the light-transmissive substrate functions as an excitation-light receiving surface. The fluorescence member is formed by dispersing a phosphor in a sealing material, for example, a glass material such as an inorganic glass or a resin material such as a silicone resin. The light-transmissive substrate is made of a material having a high thermal conductivity, such as sapphire.

However, this fluorescence light source device has been found to have a problem in that high luminous efficacy is not obtained because of an elevated temperature of the wavelength conversion member.

Specifically, the fluorescence member is formed by dispersing a phosphor in a sealing material, such as a silicone resin having a low thermal conductivity (thermal conductivity: 0.1 W/mK), so that the heat generated in the phosphor upon irradiation with excitation light is less likely to be transmitted, which results in an elevated temperature of the phosphor itself. The elevated temperature of the phosphor leads to temperature quenching and results in low conversion efficiency (external quantum efficiency) of converting excitation light into fluorescence, which causes luminance saturation or low luminance and thus generates insufficient fluorescence flux. A heat-dissipating member can be provided only in apart of the back surface of the light-transmissive substrate on which no fluorescence member is disposed, specifically, the peripheral part of the back surface. Therefore, the heat transmitted to the light-transmissive substrate from the fluorescence member needs to be transmitted in the direction perpendicular to the thickness direction of the light-transmissive substrate. In this way, the contact area between the light-transmissive substrate and the heat-dissipating member is small, and the distance over which the heat is transmitted to the heat-dissipating member from the fluorescence member is long, so that sufficient heat dissipation is not achieved.

Furthermore, it has been found that the fluorescence light source device of Patent Literature 3 fails to achieve high luminous efficacy because fluorescence generated inside the wavelength conversion member cannot be used effectively.

Specifically, part of fluorescence emitted from the phosphor inside the wavelength conversion member and entering the light-transmissive substrate does not exit from the front surface of the light-transmissive substrate or the fluorescence-exiting surface composed of the front surface and the side surface of the fluorescence member. The part of fluorescence repeatedly reflects in the light-transmissive substrate and exits from the side surface of the light-transmissive substrate to the outside. Since the fluorescence generated inside the wavelength conversion member cannot exit from the fluorescence-exiting surface at high efficiency in this way, fluorescence cannot be used effectively. In addition, the length and width dimensions of the light-transmissive substrate are larger than the length and width dimensions of the fluorescence member. The size of a light source of fluorescence is thus set in accordance with the length and width dimensions of the light-transmissive substrate. Therefore, the size of a light source of fluorescence is excessively large in regard to the relationship with the length and width dimensions of the fluorescence member, and the fluorescence emitted from the wavelength conversion member is guided by using an optical member such as a reflecting mirror, which leads to limited etendue. As a result, the fluorescence emitted from the wavelength conversion member cannot be used effectively.

CITATION LIST

Patent Literature

Patent Literature 1: Japanese Patent Application Laid-Open No. 2011-13316

Patent Literature 2: Japanese Patent Application Laid-Open No. 2011-198560

Patent Literature 3: Japanese Patent Application Laid-Open No. 2012-109400

SUMMARY OF INVENTION

Technical Problem

The present invention has been made in view of the foregoing circumstances and has as its object the provision of a fluorescence light source device in which, when a fluorescence member having a periodic structure layer on the surface is irradiated with excitation light, a rise in the temperature of the fluorescence member is suppressed, the reflection of the excitation light is reduced while fluorescence generated inside the fluorescence member is effectively used and emitted to the outside at high efficiency, and high luminous efficacy is obtained accordingly.

The present invention has as another object the provision of a method for producing a fluorescence light source device. This method makes it easy to produce a fluorescence light source device in which, when a fluorescence member having a periodic structure layer on the surface is irradiated with excitation light, a rise in the temperature of the fluorescence member is suppressed, the reflection of the excitation light is reduced while fluorescence generated inside the fluorescence member is effectively used and emitted to the outside at high efficiency, and high luminous efficacy is obtained accordingly.

Solution to Problem

A fluorescence light source device of the present invention includes a fluorescence member that is formed from a phosphor composed of single crystal or polycrystal and excited by excitation light, and the fluorescence member has a surface provided with a periodic structure layer made of a high refractive index material having a refractive index of not less than the refractive index of the fluorescence member, the periodic structure layer has a surface with a periodic structure having a periodic array of conical or truncated projections and formed by an etching process, and the periodic structure has an aspect ratio, which is a ratio of the height of the projections to the pitch, within a range of 0.5 to 0.9.

In the fluorescence light source device of the present invention, the projections that constitute the periodic structure in the periodic structure layer may preferably be formed on a thin film part that covers the surface of the fluorescence member.

In the fluorescence light source device of the present invention, the high refractive index material in the periodic structure layer may preferably be composed of an inorganic compound, and the periodic structure layer may preferably be constituted by a columnar structure that has a plurality of columnar units extending in a direction away from the fluorescence member.

In the fluorescence light source device of the present invention, the high refractive index material may preferably be composed of zirconia.

A method for producing a fluorescence light source device of the present invention is a method for producing the fluorescence light source device described above, and the method includes the steps of: forming, on a fluorescence member formed from a phosphor composed of single crystal or polycrystal, a high refractive index material layer made of a high refractive index material having a refractive index of not less than the refractive index of the fluorescence member; and forming a periodic structure by etching the surface of the high refractive index material layer.

Advantageous Effects of Invention

In the fluorescence light source device of the present invention, the periodic structure layer made of a high refractive index material is formed on the surface of the fluorescence member formed from a phosphor composed of single crystal or polycrystal. In the periodic structure layer, a periodic structure having a periodic array of substantially conical projections and having a particular aspect ratio is formed by an etching process. Therefore, when the fluorescence member having the periodic structure layer on the surface is irradiated with excitation light, a rise in the temperature of the fluorescence member is suppressed, and the reflection of the excitation light is also reduced while the fluorescence member has high light efficiency. In addition, fluorescence generated inside the fluorescence member is effectively used and emitted to the outside at high efficiency, so that high luminous efficacy is achieved.

The method for producing a fluorescence light source device of the present invention includes the steps of: forming, on a fluorescence member, a high refractive index material layer made of a high refractive index material having a refractive index of not lower than the refractive index of the fluorescence member; and forming a periodic structure by etching the surface of the high refractive index material layer. Since there is no need to form a periodic structure in the fluorescence member and furthermore the high refractive index material layer has good processability (ease in processing) sufficient to form a periodic structure by an etching process, a desired periodic structure can be easily formed on the surface of the high refractive index material layer. The obtained periodic structure layer thus has a desired periodic structure.

Therefore, the method for producing a fluorescence light source device of the present invention makes it easy to produce a fluorescence light source device in which, when a fluorescence member having a periodic structure layer on the surface is irradiated with excitation light, a rise in the temperature of the fluorescence member is suppressed, the reflection of the excitation light is reduced while the fluorescence member has high light efficiency and, in addition, fluorescence generated inside the fluorescence member is effectively used and emitted to the outside at high efficiency, so that high luminous efficacy is achieved.

DESCRIPTION OF EMBODIMENTS

Hereinafter, embodiments of a fluorescence light source device of the present invention and a method for producing a fluorescence light source device of the present invention will be described.

Figure 1:
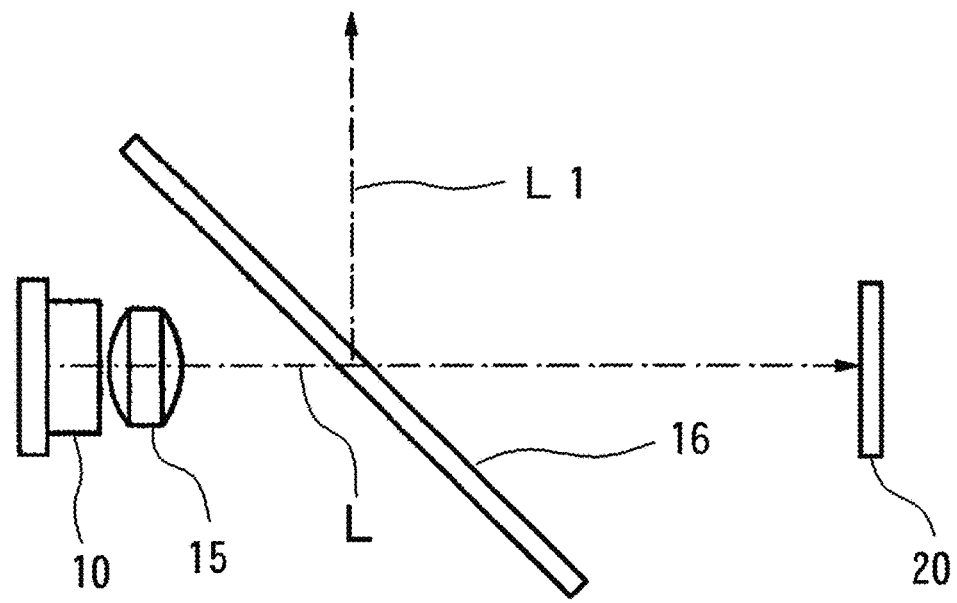
FIG. 1 is an explanatory diagram schematically illustrating the structure of an example of a fluorescence light source device of the present invention.
Figure 2:
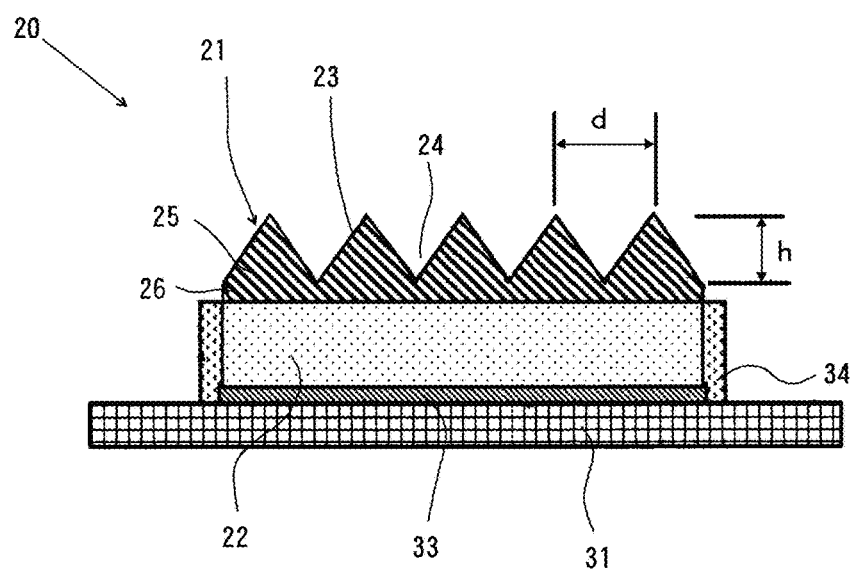
FIG. 2 is an explanatory cross-sectional view illustrating the structure of a wavelength conversion member in the fluorescence light source device of FIG. 1.

FIG. 1 is an explanatory diagram schematically illustrating the structure of an example of a fluorescence light source device of the present invention. FIG. 2 is an explanatory cross-sectional view illustrating the structure of a wavelength conversion member in the fluorescence light source device of FIG. 1.

The fluorescence light source device includes a laser diode 10 that emits light in the blue region and a fluorescence-emitting member 20 that is disposed to face the laser diode 10. The fluorescence-emitting member 20 includes a wavelength conversion member 21 that emits fluorescence L1 in the green region when excited by excitation light L, which is laser light emitted from the laser diode 10.

A collimator lens 15 through which the incident excitation light L from the laser diode 10 exits as parallel rays is disposed at a position adjacent to the laser diode 10 and located between the laser diode 10 and the fluorescence-emitting member 20. In addition, a dichroic mirror 16 is disposed between the collimator lens 15 and the fluorescence-emitting member 20 while being inclined at an angle of, for example, 45° with respect to the optical axis of the collimator lens 15. This dichroic mirror 16 transmits the excitation light L from the laser diode 10 and reflects the fluorescence L1 from the wavelength conversion member 21.

In the fluorescence-emitting member 20, as illustrated in FIG. 2, a wavelength conversion member 21 having a substantially rectangular plate shape is disposed on the front surface (the upper surface in FIG. 2) of a substrate 31 having a rectangular plate shape.

The fluorescence-emitting member 20 is disposed such that the front surface (the upper surface in FIG. 2) of the wavelength conversion member 21 faces the laser diode 10. The front surface functions as an excitation-light receiving surface and a fluorescence-exiting surface.

The back surface (the lower surface in FIG. 2) of the wavelength conversion member 21 is provided with a light reflection film 33. The side surface of the wavelength conversion member 21 is in contact with an annular light diffusion layer 34. In this way, the back surface and the side surface of the wavelength conversion member 21 are provided with the light reflection film 33 and the light diffusion layer 34, respectively. This configuration allows the back surface and the side surface of the wavelength conversion member 21 to have a reflective function. A bonding layer (not shown) made of a bonding material is interposed between the substrate 31 and the light reflection film 33 disposed on the back surface of the wavelength conversion member 21. The wavelength conversion member 21 is bonded to the substrate 31 via the bonding material. A bonding material having a thermal conductivity of not lower than 40 W/mK, such as solder or a silver sintered material, is used from the viewpoint of heat dissipation. The back surface of the substrate 31 is provided with a heat-dissipating member, such as a heat-dissipating fin (not shown).

In the example of this figure, the bonding material is a solder ribbon having length and width dimensions larger than the length and width dimensions of the back surface of the wavelength conversion member 21. The solder ribbon is used as a preform. The light diffusion layer 34 is formed in contact with the side surface of the wavelength conversion member 21, the side surface of the light reflection film 33, and the side surface of the bonding layer. The light reflectance of the light diffusion layer 34 at a wavelength of 550 nm is 95.7%, and thus the light extraction efficiency of the fluorescence-exiting surface in the fluorescence light source device is 1.28 times that in the case without the light diffusion layer 34.

As the light reflection film 33, for example, a silver reflection film is used.

The back surface of the wavelength conversion member 21 on which this light reflection film 33 is to be disposed has been polished, and the surface roughness Ra of the back surface determined with a laser interferometer may preferably be not more than 100 nm.

When the surface roughness Ra of the back surface of the wavelength conversion member 21 is within the aforementioned range, disposing the light reflection film 33 formed of a silver reflection film on the back surface allows the mirror reflection of the excitation light L and the fluorescence L1 off the back surface. Therefore, the reflectance of the back surface of the wavelength conversion member 21 can be set to not lower than 97%.

In contrast, when the surface roughness Ra of the back surface of the wavelength conversion member 21 is more than 100 nm, the back surface fails to have a sufficient reflective function. Specifically, the excitation light L and the fluorescence L1 that reach the back surface of the wavelength conversion member 21 repeatedly reflect between the back surface of the wavelength conversion member 21 and the light reflection film 33 formed of a silver reflection film. The excitation light L and the fluorescence L1 are absorbed during the process of repeated reflection. Since the amount of light absorbed increases with an increasing number of times of repeated reflection, the back surface of the wavelength conversion member 21 fails to have sufficient reflectance.

The light diffusion layer 34 is formed of an inorganic diffusion material, specifically, light-diffusing microparticles made of an inorganic compound. The light diffusion layer 34 may preferably be obtained by applying a uniform suspension of light-diffusing microparticles in an alkaline aqueous solution to the periphery of the wavelength conversion member 21 bonded on the substrate 31, and drying the coating layer under the condition at a temperature of, for example, 150° C. for, for example, 30 minutes.

When the light diffusion layer 34 is formed by drying the suspension, the light-diffusing microparticles are likely to aggregate in applying the suspension to the periphery of the wavelength conversion member 21, and the suspension does not permeate the front surface of the wavelength conversion member 21. Therefore, the shape of the front surface of the wavelength conversion member 21 (the shape of a periodic structure 24) does not change in the process for producing the light diffusion layer 34. When an organic solvent, such as silicone, is used instead of an alkaline aqueous solution in the process for producing the light diffusion layer, the light-scattering microparticles are dissolved in the organic solvent, and the organic solvent in which the light-scattering microparticles are dissolved permeates the front surface of the wavelength conversion member. Therefore, in the process for producing the light diffusion layer, the shape of the front surface of the wavelength conversion member (the shape of the periodic structure) changes, and the front surface of the wavelength conversion member does not have a desired shape. That is, the front surface of the wavelength conversion member is the surface at which a difference in refractive index from that of the air steeply changes. Therefore, the front surface of the wavelength conversion member does not have an effect of reducing the reflection of excitation light or an effect of improving the efficiency of fluorescence extraction by diffraction.

The average primary particle size of the light-diffusing microparticles may preferably be not less than 2 nm and not more than 0.1 µm.

When the particle size of the light-diffusing microparticles is within the aforementioned range, the light diffusion layer 34 can easily diffuse the fluorescence L1 in all directions. Therefore, the light diffusion layer 34 can assuredly change the traveling direction of part of the fluorescence L1 into the direction toward the fluorescence-exiting surface, that is, the front surface of the wavelength conversion member 21. Therefore, the wavelength conversion member 21 can emit the fluorescence L1 from the fluorescence-exiting surface to the outside at high efficiency.

As examples of the inorganic compound that constitutes the light-diffusing microparticles, may be mentioned metal oxides, such as silica ($SiO_2$), titanium oxide ($TiO_2$), zinc oxide (ZnO), aluminum oxide ($Al_2O_3$), and magnesium oxide (MgO), and metal sulfates, such as barium sulfate.

In the light diffusion layer 34, the light-diffusing microparticles may be made of a single material or may be made of two or more different materials in any combination.

The wavelength conversion member 21 includes a fluorescence member 22 having a rectangular plate shape and a periodic structure layer 23 that has the periodic structure 24 formed on its front surface (the upper surface in FIG. 2) and that is formed on the front surface (the upper surface in FIG. 2) of the fluorescence member 22.

In this wavelength conversion member 21, the periodic structure layer 23 has length and width dimensions of not larger than the length and width dimensions of the fluorescence member 22 and is disposed to cover at least part of the front surface of the fluorescence member 22.

In the example of this figure, the periodic structure layer 23 has length and width dimensions equal to those of the fluorescence member 22 and is disposed to cover the entire front surface of the fluorescence member 22.

The fluorescence member 22 is formed of a monocrystalline or polycrystalline phosphor. The thickness of the fluorescence member 22 is, for example, 0.05 to 2.0 mm from the viewpoints of the heat dissipation and the conversion efficiency (external quantum efficiency) of converting the excitation light L into the fluorescence L1.

When the fluorescence member 22 is formed of a monocrystalline or polycrystalline phosphor, the fluorescence member 22 has a high thermal conductivity of not lower than 11 W/mK.

When the fluorescence member 22 has a thermal conductivity of not lower than 11 W/mK, the fluorescence member 22 can efficiently dissipate the heat generated by irradiation with the excitation light L, which prevents the fluorescence member 22 from increasing its temperature. As a result, a decrease in the amount of fluorescence due to temperature quenching in the phosphor can be suppressed.

The monocrystalline phosphor that constitutes the fluorescence member 22 can be obtained by, for example, the Czochralski method. Specifically, a seed crystal is brought into contact with a molten raw material in a crucible. In this state, the seed crystal is pulled up in the vertical direction while being rotated. The seed crystal is grown into a single crystal accordingly to form a monocrystalline phosphor.

The polycrystalline phosphor that constitutes the fluorescence member 22 can be obtained, for example, in the following manner. First, submicron-sized or finer raw-material microparticles are obtained by pulverizing raw materials, such as a base material, an activator, and a firing auxiliary, with a ball mill or the like. Next, the raw-material microparticles are molded and sintered by, for example, a slip cast method. Subsequently, the obtained sintered body is subjected to hot isostatic pressing to obtain a polycrystalline phosphor having a porosity of, for example, not more than 0.5%.

As specific examples of the phosphor that constitutes the fluorescence member 22, may be mentioned YAG:Ce, YAG:Pr, YAG:Sm and LuAG:Ce. In such a phosphor, the amount of a rare earth element (activator) doped is about 0.5 mol %.

The periodic structure layer 23 has the periodic structure 24 formed on the front surface of the wavelength conversion member 21 that serves as the excitation-light receiving surface. The thickness (maximum thickness) of the periodic structure layer 23 is, for example, not more than 1.0 µm.

In the example of this figure, the thickness of the periodic structure layer 23 is the sum of the thickness of a thin film part 26 and the height h of projections 25.

The periodic structure layer 23, as illustrated in FIG. 2, may preferably be constituted by the thin film part 26 having a plate shape and covering the front surface of the fluorescence member 22, and a plurality of projections 25 disposed on the thin film part 26.

When the periodic structure layer 23 has the thin film part 26, the periodic structure layer 23 has a function of protecting the fluorescence member 22, which makes it easy to handle the wavelength conversion member 21.

Specifically, when the periodic structure layer 23 has the thin film part 26, the fluorescence member 22 having low moisture resistance can be protected from moisture, which reduces or prevents deterioration of the fluorescence member 22 due to moisture. When the periodic structure layer 23 has the thin film part 26 and external force is applied to the projections 25, for example, during the production process in which the wavelength conversion member 21 is bonded to the substrate 31, the projections 25 can be prevented from falling out. Therefore, the wavelength conversion member 21 is easy to handle. When the periodic structure layer 23 has no thin film part 26, that is, the plurality of projections 25 are individually disposed directly on the front surface of the fluorescence member 22, sufficient adhesion is not obtained between each projection 25 and the fluorescence member 22 because of a small contact area, and thus small external force even may cause the projections 25 to fall out. In addition, the minimum thickness of the periodic structure layer 23, specifically, the thickness of the parts between adjacent projections 25 is extremely small, which may cause a failure of sufficient protection of the fluorescence member 22 from moisture.

The thin film part 26 may preferably be thin from the viewpoint of the effective use of the fluorescence L1. Specifically, the thickness of the thin film part 26 may preferably be not more than 0.4 μm.

When the thickness of the thin film part 26 is excessively large, the fluorescence L1 may not be allowed to exit from the fluorescence-exiting surface of the wavelength conversion member 21 to the outside at sufficiently high efficiency because the fluorescence L1 traveling toward the side surface of the thin film part 26 among the fluorescence L1 generated inside the fluorescence member 22 exits from the side surface of the thin film part 26.

The plurality of projections 25 that constitute the periodic structure 24, as illustrated in FIG. 2, each have a substantially conical shape and taper down toward the front surface from the back surface. The plurality of projections 25 are periodically arranged on the thin film part 26.

Figure 3:
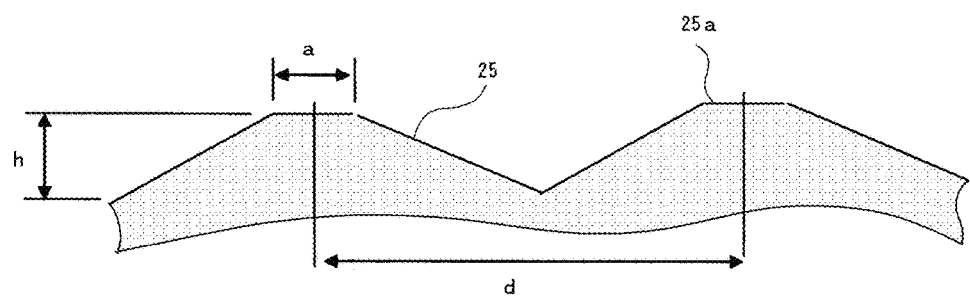
FIG. 3 is an explanatory diagram schematically illustrating a modification of a periodic structure in the wavelength conversion member.

Specifically, the substantially conical shape of the projections 25 is a conical shape (circular conical shape in FIG. 2) as illustrated in FIG. 2 or a truncated shape as illustrated in FIG. 3.

When the projections 25 have a truncated shape, the dimension (maximum dimension) a of an upper base 25a is less than the wavelength of the excitation light L. For example, when the projections 25 have a circular truncated conical shape and the excitation light L has a wavelength of 445 nm, the dimension (outer diameter) of the upper base 25a of the projection 25 having a circular truncated conical shape is 100 nm.

In the example of this figure, the periodic structure 24 has a two-dimensional periodic array of dense projections 25 having a circular conical shape.

When the projections 25 have a conical shape or truncated shape, the reflection of the excitation light L off the front surface of the fluorescence member 22 can be prevented or reduced. Such an effect is obtained on the basis of the following reasons.

Figure 4:
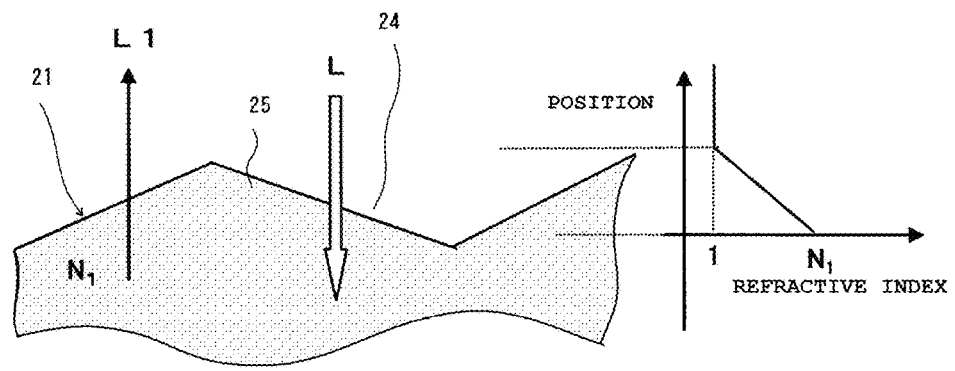
FIG. 4 is a diagram macroscopically illustrating the changes in the refractive index of a medium that transmits excitation light when the excitation light enters the front surface of the wavelength conversion member in the direction perpendicular to the front surface.

FIG. 4 is a diagram macroscopically illustrating the changes in the refractive index of a medium that transmits the excitation light L when the excitation light L enters the front surface of the wavelength conversion member 21 in the direction perpendicular to the front surface. The cross-sectional view on the left side schematically illustrates an enlarged portion of the wavelength conversion member 21. The graph on the right side illustrates the macroscopic relationship between the refractive index and the position in the direction perpendicular to the front surface of the wavelength conversion member 21. As illustrated in FIG. 4, when the excitation light L is delivered to the wavelength conversion member 21 from the air (refractive index: 1), specifically, the front surface of the periodic structure layer 23 (refractive index: $N_1$), the excitation light L enters the wavelength conversion member 21 in the oblique direction with respect to the tapered surfaces of the projections 25 that constitute the periodic structure 24. From a macroscopic viewpoint, the refractive index of the medium that transmits the excitation light L gradually changes from 1 to $N_1$ in the direction perpendicular to the front surface of the wavelength conversion member 21. Therefore, there is substantially no interface on the front surface of the wavelength conversion member 21 at which the refractive index steeply changes, which prevents or reduces the reflection of the excitation light L off the front surface of the wavelength conversion member 21.

In the projections 25, the inclined angle of the tapered surface (side surface) (the angle formed by the side surface and the bottom surface) may preferably be not less than 11°.

When the inclined angle of the tapered surface is less than 11°, the tapered surface is regarded as the interface between two media having a different refractive index, which may produce reflected light in accordance with a difference in refractive index.

In the periodic structure 24, the aspect ratio which is a ratio (h/d) of the height h of the projections 25 to the pitch d is within a range of 0.5 to 0.9.

When the aspect ratio of the periodic structure 24 is within a range of 0.5 to 0.9, as apparent from the experiments described below, it is easy to form the periodic structure 24, and the reflection of the excitation light L is reduced upon irradiation of the front surface of the periodic structure layer 23 with the excitation light L, which allows a sufficient amount of the excitation light L to be introduced into the wavelength conversion member 21. In addition, the wavelength conversion member 21 has high light efficiency. Furthermore, as illustrated in FIG. 2, when the front surface of the periodic structure layer 23 serves as the fluorescence-exiting surface, the periodic structure 24 leads to the diffraction of the fluorescence L1, and thus the front surface of the periodic structure layer 23 has high light extraction efficiency.

The light efficiency of the wavelength conversion member here denotes the fluorescence conversion ability of the wavelength conversion member, specifically, the ability of the wavelength conversion member to convert excitation light into fluorescence. The light efficiency is a product of the excitation-light transmittance of the excitation-light receiving surface and the light extraction efficiency of the fluorescence-exiting surface, that is, a value calculated in accordance with the following formula (1) on the basis of the excitation-light reflectance of the excitation-light receiving surface and the light extraction efficiency of the fluorescence-exiting surface. Since the product of the excitation-light transmittance and the light extraction efficiency is proportional to the fluorescence efficiency of the fluorescence member, the product can be regarded as the rate at which the wavelength conversion member converts excitation light into fluorescence. The wavelength conversion member with increasing light efficiency has greater fluorescence conversion ability.

Light efficiency of wavelength conversion member=
(1−excitation-light reflectance of excitation-light receiving surface)×(light extraction efficiency of fluorescence-exiting surface)   Formula (1):

In contrast, when the aspect ratio (h/d) is out of the aforementioned range, the front surface of the wavelength conversion member 21 is close to a plane. Thus, the effect of reducing the reflection of the excitation light L and the effect of extracting the fluorescence L1 by diffraction are not obtained sufficiently, and high light efficiency is not obtained. In addition, the projections 25 having a desired shape, that is, a substantially conical shape, cannot be formed. These problems become noticeable when the aspect ratio (h/d) is more than 0.9.

Specifically, when the aspect ratio (h/d) is more than 0.9, the projections need to be high enough, which elongates the processing time for forming the periodic structure and significantly reduces processing efficiency. In addition, when the periodic structure is formed by an etching process as described in the method for producing a fluorescence light source device (wavelength conversion member forming step) described below, the shape of the obtained projections is a pillar shape, namely, a vertically standing columnar shape. The reason for this is that, since the etching process involves forming the periodic structure by isotropic etching with radicals of an etching gas and anisotropic etching with ions, isotropic etching predominates in consideration of the processing time for heightening the projections. Furthermore, in the formed periodic structure, plane portions (exposed portions of the fluorescence member or the thin film part) are formed between the lower bases of the projections each having a pillar shape. Therefore, the excitation-light reflectance is large while the effect of extracting fluorescence by diffraction is not obtained sufficiently.

In the periodic structure 24, the pitch d may preferably be a distance in a range where the diffraction of the fluorescence L1 emitted from the phosphor that constitutes the fluorescence member 22 occurs (Bragg's condition).

Specifically, the pitch d of the periodic structure 24 is a value (hereinafter referred to as an "optical length") obtained by dividing the peak wavelength of the fluorescence L1 emitted from the phosphor by the refractive index of the material constituting the periodic structure 24 (a high refractive index material that constitutes the periodic structure layer 23), or about several times the optical length.

The pitch of the periodic structure in the present invention refers to a distance between adjacent projections (center-to-center distance) (nm) in the periodic structure.

When the pitch d of the periodic structure 24 is a distance in a range where the diffraction of the fluorescence L1 generated in the wavelength conversion member 21 occurs, the fluorescence L1 is allowed to exit through the front surface of the wavelength conversion member 21 to the outside at high efficiency.

Figure 5:
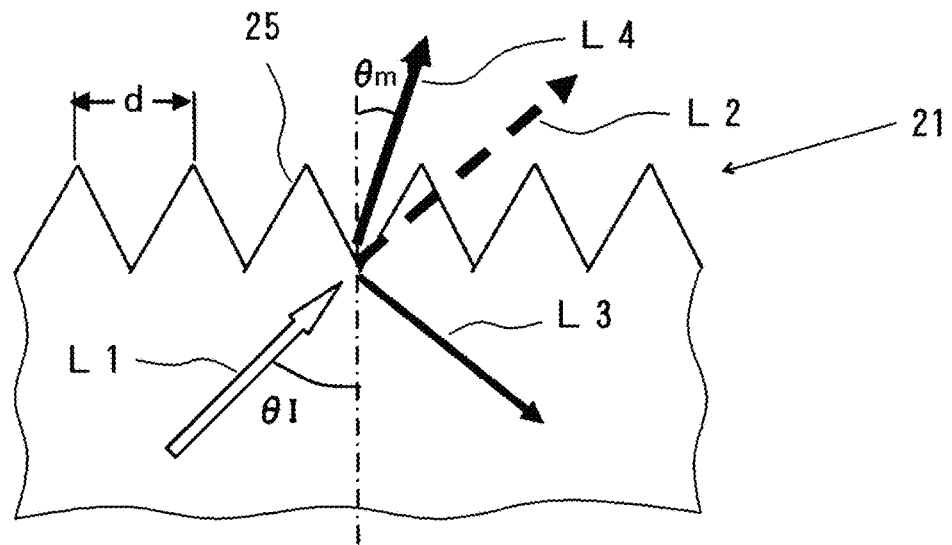
FIG. 5 is an explanatory diagram schematically illustrating the reflection and diffraction of fluorescence on the front surface of the wavelength conversion member.

Specifically, as illustrated in FIG. 5, when the angle θI of incidence of the fluorescence L1 generated in the wavelength conversion member 21 (specifically, in the fluorescence member 22) with respect to the front surface of the wavelength conversion member 21 (the interface between the wavelength conversion member 21 and the air) is less than the critical angle, the fluorescence L1 can be extracted from the front surface of the wavelength conversion member 21 to the outside without reflection as penetrating light L2 that penetrates the front surface of the wavelength conversion member 21. When the angle θI of incidence of the fluorescence L1 with respect to the front surface of the wavelength conversion member 21 is not less than the critical angle and, for example, the front surface of the wavelength conversion member 21 is a flat surface, the fluorescence L1 is totally reflected off the front surface of the wavelength conversion member 21 and travels toward the inside of the wavelength conversion member 21 as reflected light L3. Thus, the fluorescence L1 is not extracted from the front surface of the wavelength conversion member 21 to the outside. However, when the periodic structure 24 having a pitch d that satisfies the aforementioned condition is formed on the front surface of the wavelength conversion member 21, the diffraction of the fluorescence L1 occurs on the front surface of the wavelength conversion member 21 because of the periodic structure 24. As a result, the fluorescence L1 is allowed to exit through the front surface of the wavelength conversion member 21 at an emitting angle of θm (θm<θI) as negative-first order diffraction light L4 and is extracted to the outside.

As the material that constitutes the periodic structure layer 23, a high refractive index material having a refractive index of not less than the refractive index of the fluorescence member 22 is used.

When the periodic structure layer 23 is made of a high refractive index material, the fluorescence L1 that enters the interface between the fluorescence member 22 and the periodic structure layer 23 is refracted because of the penetration through the interface. Therefore, the traveling direction of the fluorescence L1 changes at the interface between the fluorescence member 22 and the periodic structure layer 23, which inhibits the fluorescence L1 from being confined in the wavelength conversion member 21 and, as a result, allows the fluorescence L1 to exit through the front surface of the periodic structure layer 23 to the outside at high efficiency.

When a high refractive index material having a refractive index higher than that of the fluorescence member 22 is used, the periodic structure 24 having a small pitch d can be formed. Consequently, the projections 25 that constitute the periodic structure 24 can be designed to be short even if the aspect ratio (h/d) is large, which facilitates formation of the periodic structure 24. For example, when a nanoprinting method is used, it is easy to produce a mold and perform imprinting. At this time, the energy that excites the phosphor in the wavelength conversion member 21 has an excitation density of not less than about 5 W/mm$^2$, and thus the high refractive index material that constitutes the periodic structure layer 23 is desirably composed of an inorganic compound.

The periodic structure layer 23 may preferably have a columnar structure that has a plurality of columnar units (inorganic-compound columnar units) composed of an inorganic compound with high reflective index and extending in a direction away from the fluorescence member 22 (upwardly in FIG. 2). That is, the periodic structure layer 23 may preferably have a columnar structure extending in the direction away from the fluorescence member 22.

Specifically, this columnar structure is composed of a plurality of columnar units, and each of these columnar units extends in the direction away from the fluorescence member 22. The columnar structure is a porous structure in which fine gaps are formed between adjacent columnar units.

When the periodic structure layer 23 is constituted by the columnar structure, the material for forming the periodic structure layer 23 has good processability (ease in processing), and the periodic structure 24 can be processed into a desired shape.

In the periodic structure layer 23, each of the plurality of projections 25 that constitute the periodic structure 24 may preferably be composed of a columnar unit.

When the projection 25 is composed of a columnar unit, the projection 25 can be assuredly processed into a desired shape by the method for producing a fluorescence light source device (wavelength conversion member forming step) described below.

As specific examples of the high refractive index material that constitutes the periodic structure layer 23, may be mentioned metal oxides, such as alumina ($Al_2O_3$), hafnium oxide ($HfO_2$), magnesium oxide (MgO), tin oxide ($SnO_2$), tungstic oxide ($WO_3$), yttrium oxide ($Y_2O_3$), indium tin oxide (ITO), zirconia ($ZrO_2$), tantalum oxide ($Ta_2O_5$), titanium oxide ($TiO_2$), and niobium oxide ($Nb_2O_5$) and a mixture of zirconia ($ZrO_2$) and titanium oxide ($TiO_2$). Of these, zirconia (thermal expansion coefficient: $10.5 \times 10^{-6}$/K), indium tin oxide (thermal expansion coefficient: $6.8 \times 10^{-6}$/K), and titanium oxide (thermal expansion coefficient: $7.9 \times 10^{-6}$/K) are preferred because they have a thermal expansion coefficient close to the thermal expansion coefficient ($6 \times 10^{-6}$ to $8 \times 10^6$/K) of a phosphor (LuAG, YAG). Zirconia and hafnium oxide are preferred because they have high moisture resistance. In particular, zirconia is more preferred because it has a small absorption coefficient (specifically 13 $cm^{-1}$ (absorption coefficient for light having a wavelength of 550 nm)).

As the material that constitutes the substrate 31, for example, an aluminum substrate provided with a heat-dissipating adhesive in which a fine metal powder is mixed with a resin can be used. The thickness of the substrate 31 is, for example, 0.5 to 1.0 mm. The aluminum substrate may also function as a heat-dissipating fin.

The fluorescence light source device 10 having the aforementioned structure can be produced, for example, by obtaining the wavelength conversion member 21 via a particular step described below.

Specifically, the wavelength conversion member 21 is obtained via a step for forming a high refractive index material layer made of a high refractive index material on the fluorescence member 22, and etching the front surface of the high refractive index material layer (hereinafter referred to as a "wavelength conversion member forming step").

The wavelength conversion member forming step will be described by way of a specific example. In this specific example, the periodic structure layer 23 of the obtained wavelength conversion member 21 has a columnar structure that has a plurality of columnar units composed of an inorganic compound with a high refractive index and extending in the direction away from the fluorescence member 22.

First, a high refractive index material layer for forming the periodic structure layer 23 (hereinafter also referred to as a "periodic structure layer forming layer") is formed on the entire front surface of the fluorescence member 22. This periodic structure layer forming layer has a columnar structure composed of an inorganic compound with a high refractive index and extending in the direction away from the fluorescence member 22 and has a substantially flat surface.

As a method for forming the periodic structure layer forming layer, a sputtering method may preferably be used.

Since the shape of the resulting sputtered film can be controlled by adjusting the sputtering conditions according to the sputtering method, it is easy to obtain a periodic structure layer forming layer having a desired columnar structure.

In the present invention, the sputtering method conceptually encompasses a reactive sputtering method. In forming a sputtering film by the reactive sputtering method, a reactive sputtering apparatus is used.

In the obtained periodic structure layer forming layer, the ratio of the length to the width of the columnar units that form the periodic structure layer forming layer (hereinafter also referred to as a "columnar unit aspect ratio") may preferably be not less than 1.3.

When the columnar unit aspect ratio in the periodic structure layer forming layer is within the aforementioned range, the processability of the periodic structure layer forming layer by an etching method is further improved, and thus the periodic structure layer 23 can be processed to have a desired shape.

In order to form the periodic structure layer forming layer by the sputtering method, the sputtering conditions need to be controlled.

Specifically, low high-frequency power may preferably be applied between the fluorescence member 22 and the target substance, and the flow rate of an inert gas may preferably be made low.

The application of low high-frequency power results in a low temperature of the fluorescence member 22 in forming a sputtered film. Therefore, this prevents or reduces recrystallization in the sputtered film formed on the fluorescence member 22 and allows the sputtered film thus obtained to have a desired columnar structure.

When the flow rate of an inert gas is relatively small, the sputtered film formed on the fluorescence member 22 has a fine structure, specifically, a porous structure having a large columnar unit aspect ratio and containing fine gaps between the columnar units, and has a high refractive index.

In order to obtain the sputtered film having a high refractive index, oxygen gas may preferably be introduced together with an inert gas.

Specifically, when a zirconia-sputtered film is formed as the periodic structure layer forming layer by using a sputtering apparatus, the high-frequency power applied between the fluorescence member 22 and the target substance (zirconia) may preferably be not more than 450 W, more preferably not more than 250 W.

The flow rate of an inert gas, such as argon gas, may preferably be 1 to 20 sccm. The flow rate of oxygen gas, which is introduced together with an inert gas as necessary, may preferably be 0.1 to 3 sccm.

In this example, the periodic structure layer forming layer is composed of a zirconia-sputtered film and has a thickness of about 600 nm (specifically 550 nm). This periodic structure layer forming layer was formed over 4 hours by using a sputtering apparatus under the following formation conditions: the target substance was zirconia, high-frequency power was 250 W, the flow rate of argon gas, which is an inert gas, was 20 sccm, and the flow rate of oxygen gas was 0.5 sccm. During the formation of this sputtered film, the temperature (surface temperature) of the fluorescence member 22 is not higher than 100° C.

Subsequently, a resist film is formed on the front surface of the periodic structure layer forming layer, which is formed on the fluorescence member 22, by, for example, a spin coating method. This resist film is patterned by a nanoimprinting method.

Then, the periodic structure layer 23 having the periodic structure 24 in which the projections 25 are periodically formed on the front surface is obtained by subjecting the periodic structure layer forming layer having a resist pattern film on the front surface to a dry etching process.

As specific examples of the dry etching process, may be mentioned an ICP (inductive coupling plasma) etching method.

The formation conditions for forming the periodic structure 24 by the ICP etching method are appropriately set in accordance with the shape of the periodic structure 24 (specifically, for example, the shape of the projections 25 and the aspect ratio (h/d) of the periodic structure 24) and the like and, as necessary, in consideration of the material of the periodic structure layer forming layer and the columnar unit aspect ratio and the like.

As specific examples of the etching gas to be used, may be mentioned silane gas ($SiH_4$), silicon tetrafluoride gas ($SiF_4$), diborane gas ($B_2H_6$) and boron trichloride gas ($BCl_3$). High-frequency power is 100 to 700 W, and bias power is 1 to 30 W.

In this example, the periodic structure 24 of the periodic structure layer 23 was formed by the ICP etching method over a treatment time of 1016 sec under the following formation conditions: the etching gas was boron trichloride gas ($BCl_3$), high-frequency power was 225 W, and bias power was 6 W.

Subsequently, the wavelength conversion member 21 having a structure as illustrated in FIG. 2 is obtained by removing the residual resist pattern film remaining on the formed periodic structure layer 23 with an organic solvent.

Figure 6:
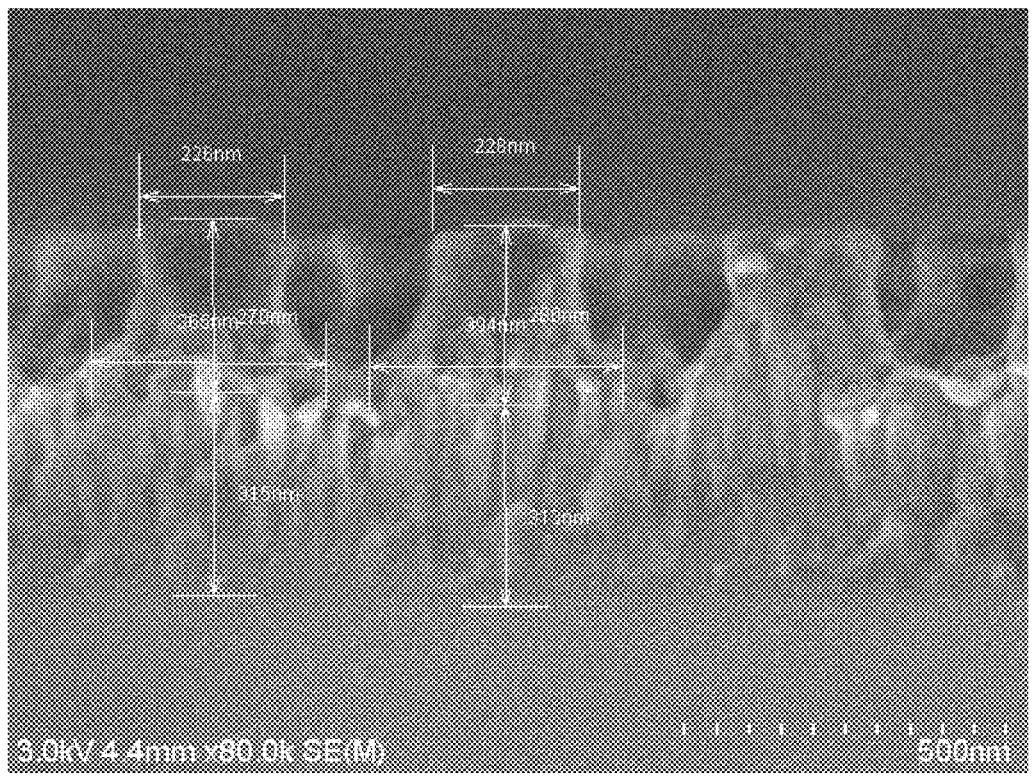
FIG. 6 is a SEM image of an example of a wavelength conversion member prepared by a method for producing a fluorescence light source device of the present invention.

An example SEM photograph of the wavelength conversion member 21 obtained after the wavelength conversion member forming step described above is illustrated in FIG. 6. The columnar unit aspect ratio of the wavelength conversion member 21 is 3.0.

The wavelength conversion member 21 thus obtained is bonded to the substrate 31, which may have alight reflection film 33 as necessary, and a light diffusion layer 34 is disposed as necessary to obtain the fluorescence-emitting member 20. The fluorescence-emitting member 20, a laser diode 11 and other components are disposed at appropriate positions to produce a fluorescence light source device.

In the fluorescence light source device described above, the excitation light L, which is laser light in the blue region emitted from the laser diode, is converted into parallel rays by the collimator lens 15. Subsequently, the excitation light L penetrates the dichroic mirror 16 and is delivered to the excitation-light receiving surface of the wavelength conversion member 21 in the fluorescence-emitting member 20, that is, the front surface of the periodic structure layer 23 in the direction substantially perpendicular to the front surface. The excitation light L then enters the fluorescence member 22 through the periodic structure layer 23. In the fluorescence member 22, the phosphor that constitutes the fluorescence member 22 is excited. This causes the fluorescence L1 to be emitted from the fluorescence member 22. This fluorescence L1 is emitted from the fluorescence-exiting surface, that is, the front surface of the periodic structure layer 23, reflected by the dichroic mirror 16 in the vertical direction, and then allowed to exit to the outside of the fluorescence light source device.

In this fluorescence light source device, the periodic structure layer 23 is disposed on the front surface of the fluorescence member 22. The excitation-light receiving surface and the fluorescence-exiting surface are formed by the front surface of this periodic structure layer 23. The periodic structure 24 that includes a periodic array of the projections 25 having a substantially conical shape and that has an aspect ratio (h/d) within a range of 0.5 to 0.9 is formed on the front surface of the periodic structure layer 23. Thus, the reflection of the excitation light L is reduced upon irradiation of the front surface of the periodic structure layer 23, which is the excitation-light receiving surface of the wavelength conversion member 21, with the excitation light L. As a result, a sufficient amount of the excitation light L can be introduced into the fluorescence member 22 in the wavelength conversion member 21. Since the diffraction of the fluorescence L1 emitted from the phosphor that constitutes the fluorescence member 22 occurs in the periodic structure 24, the fluorescence L1 can be extracted to the outside from the front surface of the periodic structure layer 23, which is the fluorescence-exiting surface of the wavelength conversion member 21, at high efficiency. In addition, the wavelength conversion member 21 has high light efficiency.

The fluorescence member 22 is formed of a monocrystalline or polycrystalline phosphor. Therefore, the heat generated in the fluorescence member 22 in the wavelength conversion member 21 can be efficiently transmitted to the substrate 31 and the heat-dissipating member (heat-dissipating fin) and is thus dissipated toward the back surface of the wavelength conversion member 21. As a result, arise in the temperature of the fluorescence member 22 in the wavelength conversion member 21 is suppressed, and a decrease in the amount of fluorescence due to temperature quenching in the phosphor can be suppressed.

As the material that constitutes the periodic structure layer 23, a high refractive index material having a refractive index of not less than the refractive index of the fluorescence member 22 is used. The use of such a material avoids the reflection of the fluorescence L1 at the interface between the fluorescence member 22 and the periodic structure layer 23 and thus maintains the luminous efficacy of the fluorescence L1 from the fluorescence member 22. Furthermore, the traveling direction of the fluorescence L1 changes at the interface between the fluorescence member 22 and the periodic structure layer 23, which inhibits the fluorescence L1 from being confined in the wavelength conversion member 21 and thus allows the fluorescence L1 to exit through the front surface of the periodic structure layer 23 to the outside at high efficiency.

Since the periodic structure layer 23 is disposed on the front surface of the fluorescence member 22, the length and width dimensions of the periodic structure layer 23 are naturally not larger than the length and width dimensions of the fluorescence member 22. Thus, the size of alight source of the fluorescence L1 is not excessively large in regard to the relationship with the length and width dimensions of the fluorescence member 22. Therefore, even if the fluorescence L1 emitted from the wavelength conversion member 21 is guided by using an optical member, the etendue is not limited strictly. As a result, the fluorescence L1 emitted from the wavelength conversion member 21 can be used effectively.

Consequently, this fluorescence light source device achieves high luminous efficacy because, when the wavelength conversion member 21 is irradiated with the excitation light L, a rise in the temperature of the wavelength conversion member 21 is suppressed and the reflection of the excitation light L1 is reduced while the wavelength conversion member 21 has high light efficiency and, in addition, the fluorescence L1 generated inside the wavelength conversion member 21 is effectively used and allowed to exit to the outside at high efficiency.

In this fluorescence light source device, the wavelength conversion member 21 includes the fluorescence member 22 and the periodic structure layer 23, and thus the fluorescence member 22 does not need to have a periodic structure, which facilitates formation of the periodic structure 24. Furthermore, in the periodic structure layer 23, the material that constitutes the periodic structure layer 23 has excellent processability (ease in processing) sufficient to form the periodic structure 24 by the etching process. Therefore, the periodic structure 24 having a desired shape can be easily formed via the wavelength conversion member forming step.

In this fluorescence light source device, the wavelength conversion member 21 has the back surface and the side surface each having a reflective function, which allows the excitation-light receiving surface and the fluorescence-exiting surface in the wavelength conversion member 21 to be coplanar, specifically, to be formed by the front surface of the periodic structure layer 23. This inhibits the fluorescence L1 from exiting through parts other than the front surface of the periodic structure layer 23 to the outside. Thus, the area of the surface of the wavelength conversion member 21 which receives the excitation light L is substantially equal to the area of the surface through which the fluorescence L1 is allowed to exit, which can maximize the luminance on the fluorescence-exiting surface. The entire back surface of the wavelength conversion member 21 is in contact with the heat-dissipating member (heat-dissipating fin) with the substrate 31 interposed therebetween. This configuration provides high heat-dissipating properties and thus further suppresses a decrease in the amount of fluorescence due to temperature quenching in the phosphor. As a result, significantly high luminous efficacy is achieved.

Although the embodiments of the present invention are described above, the present invention is not limited to the aforementioned embodiments, and various modifications can be made thereon.

For example, the side surface of the wavelength conversion member may preferably have a reflective function, as illustrated in FIG. 2, because it can prevent fluorescence generated inside from exiting through the side surface. However, one of the back surface and the side surface may have a reflective function. Specifically, for example, a light reflection film may be formed only on the side surface of the wavelength conversion member, and the front surface and the back surface of the wavelength conversion member may serve as the fluorescence-exiting surface.

The entire structure of the fluorescence light source device is not limited to that illustrated in FIG. 1, and various structures may be adopted. For example, in the fluorescence light source device in FIG. 1, light from one laser light source for excitation (for example, laser diode) is used. However, a fluorescence light source device may include a plurality of laser light sources for excitation and a condenser lens disposed in front of a wavelength conversion member, and the wavelength conversion member may be irradiated with condensed light. The excitation light is not limited to light from a laser diode and may be condensed LED light as long as it can excite the phosphor in the wavelength conversion member. In addition, the excitation light may be light from a lamp containing mercury, xenon, or the like. When a light source having a certain range of radiation wavelengths, such as a lamp or LED, is used, the wavelength of excitation light is within a range of predominant radiation wavelengths. However, the present invention is not limited to this.

Experimental Examples of the present invention will be described below.

Experimental Example 1

On the basis of the structure illustrated in FIG. 2, a plurality of fluorescence-emitting members including a wavelength conversion member composed of a fluorescence member and having a periodic structure with a periodic array of projections on the front surface of the fluorescence member were produced.

Experimental Example 1 was intended to investigate the effects attributed to the periodic structure itself (specifically, an effect of reducing the reflection of excitation light and an effect of improving the efficiency of fluorescence extraction by diffraction). The wavelength conversion member adopted a periodic structure formed on the front surface of the fluorescence member. The back surface of the fluorescence member was provided with a light reflection film formed of a silver reflection film, and the side surface was provided with a light diffusion layer made of an inorganic diffusion material. That is, the produced wavelength conversion member had a structure basically equivalent to that of the wavelength conversion member in FIG. 2 except that the wavelength conversion member was composed of the fluorescence member and the periodic structure was formed on the front surface of the fluorescence member.

The produced fluorescence-emitting members each had a different aspect ratio in the periodic structure of the wavelength conversion member. The aspect ratio in the wavelength conversion members had been adjusted by changing the height of projections within a range of 100 to 1100 nm. The wavelength conversion members each included circular conical projections at a pitch of 600 nm and had the following specifications.

Here, the pitch of the periodic structure denotes a distance in a range where the diffraction of fluorescence emitted from the phosphor that constitutes the fluorescence member occurs.

[Substrate]
Material: aluminum substrate, Size: 25 mm (length)×25 mm (width)×1 mm (thickness)
[Fluorescence Member]
Material: LuAG:Ce single crystal (composition=$Lu_3Al_5O_{12}$:Ce (amount of Ce doped: 0.5 mol %), Refractive index=1.83, Excitation wavelength=455 nm, Fluorescence wavelength=535 nm), Size: 1.7 mm (length)× 3.0 mm (width)×130 μm (thickness)
[Light Reflection Film]
Material: silver, Thickness: 110 nm
[Light Diffusion Layer]
Material: inorganic diffusion material (material obtained by drying a suspension containing an alkaline aqueous solution and microparticles of silica and titanium oxide), Thickness: 130 μm A fluorescence-emitting member including a wavelength conversion member having a structure and specifications that are the same as those of the wavelength conversion member having a periodic structure on the front surface as described above was produced except that no periodic structure was formed.

Figure 7:
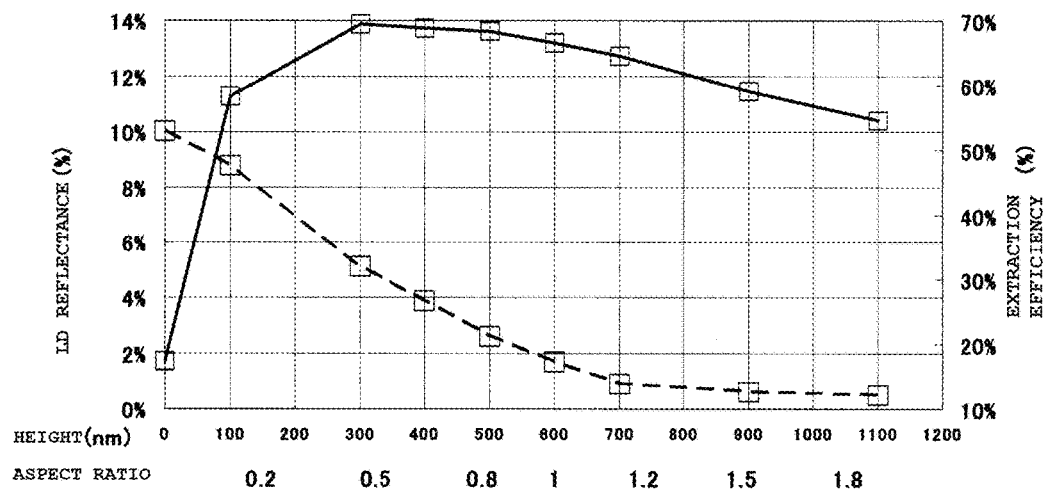
FIG. 7 is a graph illustrating the relationships between the height of projections that constitute the periodic structure (the aspect ratio in the periodic structure) on the front surface of a wavelength conversion member and the light reflectance and the light extraction efficiency of the front surface of the wavelength conversion member in Experimental Example 1.

Each of the front surfaces of the wavelength conversion members (the front surfaces of the fluorescence members) in the produced fluorescence-emitting members was irradiated with excitation light having a peak wavelength of 445 nm, and the light reflectance (LD reflectance) and the light extraction efficiency of these front surfaces were measured. The results are shown in FIG. 7. In FIG. 7, the broken line represents the measured results of the light reflectance (LD reflectance), and the solid line represents the measured results of the light extraction efficiency.

As a result, it was confirmed that, when the wavelength conversion members having the front surface with a periodic structure including an array of substantially conical projections were used and the aspect ratio of the periodic structure was within a range of 0.5 to 0.9, the reflection of excitation light off the front surfaces of the wavelength conversion members was reduced, and fluorescence generated inside the wavelength conversion member was allowed to exit to the outside at high efficiency.

Experimental Example 2

Figure 8:
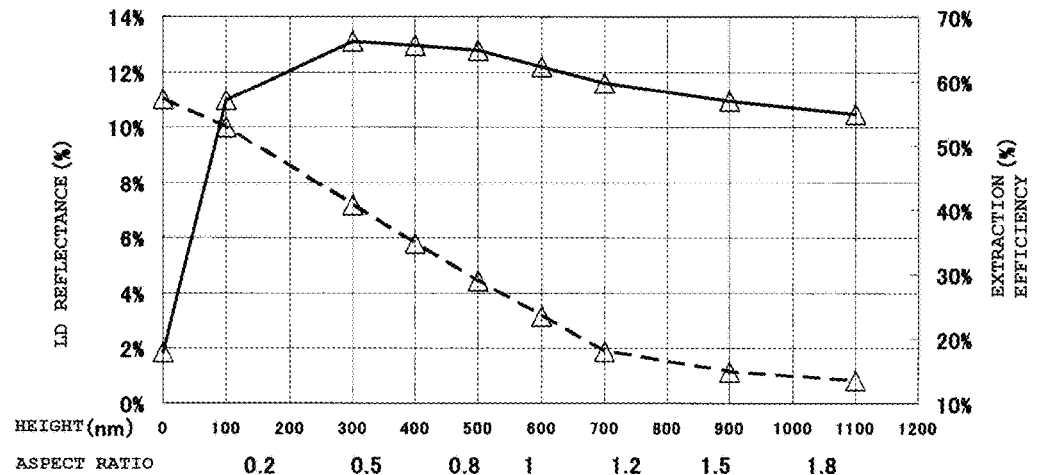
FIG. 8 is a graph illustrating the relationships between the height of projections that constitute the periodic structure (the aspect ratio in the periodic structure) on the front surface of a wavelength conversion member and the light reflectance and the light extraction efficiency of the front surface of the wavelength conversion member in Experimental Example 2.

The light reflectance (LD reflectance) and the light extraction efficiency of the front surfaces of the wavelength conversion members were measured by the same procedures as in Experimental Example 1 except that a plurality of fluorescence-emitting members were produced by using a fluorescence member having a refractive index of 2 in a wavelength conversion member and the wavelength conversion members of the produced fluorescence-emitting members were irradiated with excitation light having a peak wavelength of 465 nm in Experimental Example 1. The results are shown in FIG. 8. In FIG. 8, the broken line represents the measured results of the light reflectance (LD reflectance), and the solid line represents the measured results of the light extraction efficiency.

As a result, it was confirmed that, when the wavelength conversion members having the front surface with a periodic structure including an array of substantially conical projections were used and the aspect ratio of the periodic structure was within a range of 0.5 to 0.9, the reflection of excitation light off the front surfaces of the wavelength conversion members was reduced, and fluorescence generated inside the wavelength conversion member was allowed to exit to the outside at high efficiency.

Experimental Example 3

Figure 9:
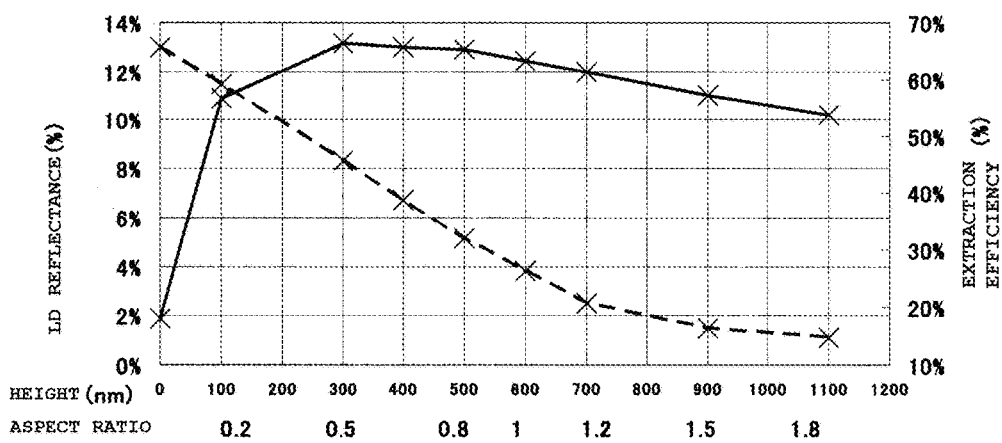
FIG. 9 is a graph illustrating the relationships between the height of projections that constitute the periodic structure (the aspect ratio in the periodic structure) on the front surface of a wavelength conversion member and the light reflectance and the light extraction efficiency of the front surface of the wavelength conversion member in Experimental Example 3.

The light reflectance (LD reflectance) and the light extraction efficiency of the front surfaces of wavelength conversion members were measured by the same procedures as in Experimental Example 1 except that a plurality of fluorescence-emitting members were produced by using a fluorescence member having a refractive index of 2.15 in a wavelength conversion member in Experimental Example 1. The results are shown in FIG. 9. In FIG. 9, the broken line represents the measured results of the light reflectance (LD reflectance), and the solid line represents the measured results of the light extraction efficiency.

As a result, it was confirmed that, when the wavelength conversion members having the front surface with a periodic structure including an array of substantially conical projections were used and the aspect ratio of the periodic structure was within a range of 0.5 to 0.9, the reflection of excitation light off the front surfaces of the wavelength conversion members was reduced, and fluorescence generated inside the wavelength conversion member was allowed to exit to the outside at high efficiency.

Figure 10:
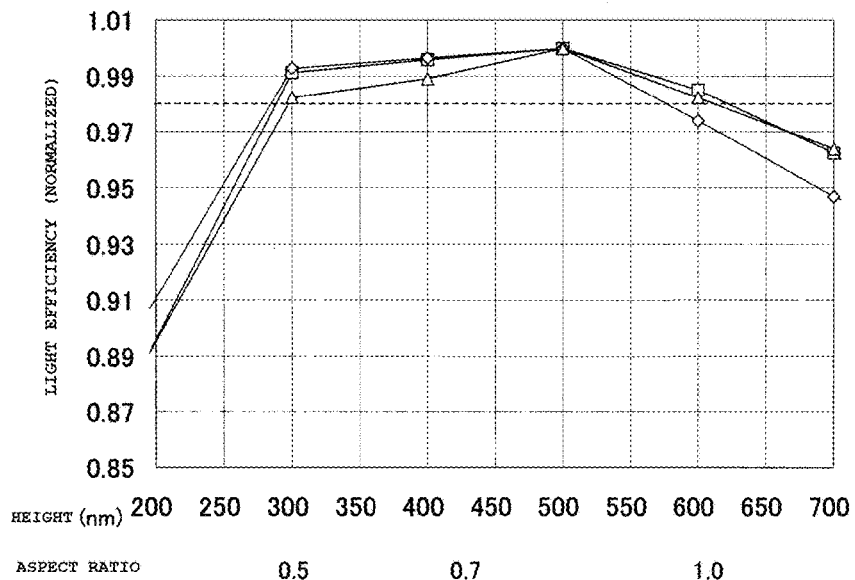
FIG. 10 is a graph illustrating the relationships between the height of projections that constitute the periodic structure (the aspect ratio in the periodic structure) on the front surface of the wavelength conversion member and the light efficiency of the wavelength conversion member. The relationships are obtained on the basis of the results of Experimental Example 1 to Experimental Example 3.
Figure 11:
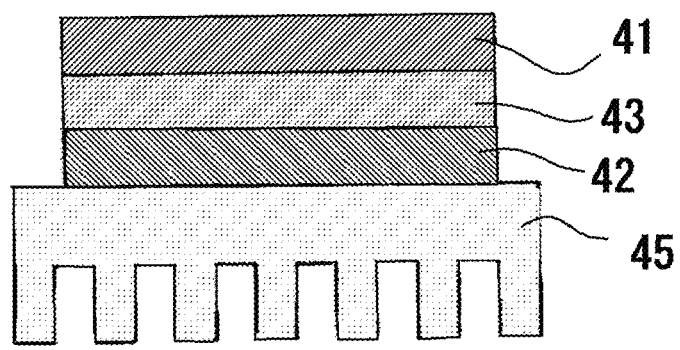
FIG. 11 is an explanatory cross-sectional view illustrating the structure of a wavelength conversion member in a conventional fluorescence light source device.

The relationship between the light efficiency of the wavelength conversion member calculated in accordance with the formula (1) above and the aspect ratio in the periodic structure was determined on the basis of the results of Experimental Example 1 to Experimental Example 3. The results are shown in FIG. 10. In FIG. 10, the squares ( ) represent a value in a case where a fluorescence member having a refractive index of 1.83 was used as the fluorescence member according to Experimental Example 1, the diamonds (◇) represent a value in a case where a fluorescence member having a refractive index of 2 was used as the fluorescence member according to Experimental Example 2, and the triangles (Δ) represent a value in a case where a fluorescence member having a refractive index of 2.15 was used as the fluorescence member according to Experimental Example 3. In the same figure, the light efficiency of the wavelength conversion members according to respective Experimental Example 1 to Experimental Example 3 including the fluorescence members having a different refractive index is normalized on the basis of the maximum light efficiency (where the aspect ratio was 0.83), and the straight broken line on the graph is a base line where the light efficiency is 0.98.

The results reveal that the light efficiency of the wavelength conversion member is the highest when the aspect ratio in the periodic structure is 0.83, regardless of the refractive index of the fluorescence member, and the light efficiency of the wavelength conversion member is not lower than 0.98 and is stably high when the aspect ratio is within a range of 0.5 to 0.9. Therefore, it was confirmed that, when the aspect ratio is within a range of 0.5 to 0.9, the wavelength conversion member has high light efficiency.

Experimental Example 4

On the basis of the structure illustrated in FIG. 2, a plurality of wavelength conversion members (21) having a different aspect ratio (h/d) of a periodic structure (24) were produced as illustrated in Table 1 below. In each of the wavelength conversion members (21), a periodic structure (24) was formed by forming a high refractive index material layer on a fluorescence member (22) by the sputtering method and dry-etching the front surface of the high refractive index material layer by the ICP etching method. The ease in processing the periodic structure (24) in the process of forming the periodic structure was evaluated on the basis of the time required for the etching process and the presence/absence of plane portions between the lower bases of projections (25) (exposed portions of the thin film part). The results are shown in Table 1. In Table 1, "A" denotes that it is easy to process, and "B" denotes that it is difficult to process.

The aspect ratio (h/d) in the produced wavelength conversion members (21) has been adjusted by changing the height (h) of the projections. The wavelength conversion members (21) each include the circular conical projections (25) at a pitch (d) of 600 nm and have the following specifications.

A periodic structure layer (23) has a columnar structure that has a plurality of columnar units extending in the direction away from the fluorescence member (22). The columnar unit aspect ratio is 3.0.

[Fluorescence Member (22)]
Material: LuAG:Ce single crystal (composition=$Lu_3Al_5O_{12}$:Ce, excitation wavelength=455 nm, fluorescence wavelength=535 nm), Refractive index=1.83, Size: 1.7 mm (length)×3.0 mm (width)×130 μm (thickness)

[Periodic Structure Layer (23)]
Material: Zirconia, Refractive index=2.1, Thickness of thin film part (26): 300 nm

TABLE 1

| ASPECT RATIO h/d | HEIGHT OF PROJECTION h (nm) | EASE IN PROCESSING |
|---|---|---|
| 1.1 | 660 | B |
| 1 | 600 | B |

TABLE 1-continued

| ASPECT RATIO h/d | HEIGHT OF PROJECTION h (nm) | EASE IN PROCESSING |
|---|---|---|
| 0.9 | 540 | A |
| 0.7 | 420 | A |
| 0.5 | 300 | A |
| 0.4 | 240 | A |

As a result, when the periodic structure layer made of a high refractive index material is formed on the front surface of the fluorescence member in the wavelength conversion member, and the aspect ratio of the periodic structure on the front surface of the periodic structure layer is within a range of 0.5 to 0.9, the height with respect to the pitch in the periodic structure is relatively small. Therefore, the time required for the dry etching process by the ICP etching method is short and the width of the lower bases of the projections is large. Thus, it was confirmed that a desired periodic structure including an array of conical or truncated projections can be easily obtained.

From FIG. 7 to FIG. 10 according to Experimental Example 1 to Experimental Example 4 and Table 1, it was confirmed that, when the aspect ratio of the periodic structure is within a range of 0.5 to 0.9, it is easy to obtain a desired periodic structure including an array of conical or truncated projections by the etching process and, in addition, the wavelength conversion member has desired optical properties.

REFERENCE SIGNS LIST 10 laser diode
15 collimator lens
16 dichroic mirror
20 fluorescence-emitting member
21 wavelength conversion member
22 fluorescence member
23 periodic structure layer
24 periodic structure
25 projection
25a upper base
26 thin film part
31 substrate
33 light reflection film
34 light diffusion layer
41 fluorescence member
42 substrate
43 barium sulfate layer
45 heat-dissipating fin L excitation light
L1 fluorescence
L2 penetrating light
L3 reflected light
L4 negative-first order diffraction light

The invention claimed is:

1. A fluorescence light source device comprising a fluorescence member that is formed from a phosphor composed of single crystal or polycrystal and excited by excitation light, wherein
    the fluorescence member has a surface provided with a periodic structure layer made of a high refractive index material having a refractive index of not less than a refractive index of the fluorescence member, the periodic structure layer has a surface with a periodic structure having a periodic array of conical or truncated projections and formed by an etching process, and the periodic structure has an aspect ratio, which is a ratio of a height of the projections to a pitch, within a range of 0.5 to 0.9,
    the projections that constitute the periodic structure in the periodic structure layer are formed on a thin film part that covers the surface of the fluorescence member, with the thickness of the thin film part being not more than 0.4 μm,
    the fluorescence member has a back surface, opposite side of the surface with the periodic structure layer, the back surface provided with a light reflection film, and
    the surface roughness Ra of the back surface is not more than 100 nm.

2. The fluorescence light source device according to claim 1, wherein the high refractive index material in the periodic structure layer is composed of an inorganic compound, and the periodic structure layer is constituted by a columnar structure that has a plurality of columnar units extending in a direction away from the fluorescence member.

3. The fluorescence light source device according to claim 1, wherein the high refractive index material is composed of zirconia.

4. A method for producing the fluorescence light source device according to claim 1, the method comprising the steps of:
    forming, on a fluorescence member formed from a phosphor composed of single crystal or polycrystal, a high refractive index material layer made of a high refractive index material having a refractive index of not less than the refractive index of the fluorescence member; and
    forming a periodic structure by etching a surface of the high refractive index material layer.

* * * * *